United States Patent
Iwata et al.

(10) Patent No.: US 12,075,643 B2
(45) Date of Patent: Aug. 27, 2024

(54) LIGHT-EMITTING ELEMENT AND LIGHT-EMITTING DEVICE

(71) Applicant: SHARP KABUSHIKI KAISHA, Sakai (JP)

(72) Inventors: Noboru Iwata, Sakai (JP); Kenji Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 469 days.

(21) Appl. No.: 17/433,446

(22) PCT Filed: Feb. 26, 2019

(86) PCT No.: PCT/JP2019/007397
§ 371 (c)(1),
(2) Date: Aug. 24, 2021

(87) PCT Pub. No.: WO2020/174595
PCT Pub. Date: Sep. 3, 2020

(65) Prior Publication Data
US 2022/0149309 A1   May 12, 2022

(51) Int. Cl.
*H01L 21/00*   (2006.01)
*H10K 50/15*   (2023.01)
*H10K 50/16*   (2023.01)

(52) U.S. Cl.
CPC ............ *H10K 50/15* (2023.02); *H10K 50/16* (2023.02)

(58) Field of Classification Search
CPC ........ H10K 50/15; H10K 50/16; H10K 50/18; H10K 50/115; H05B 33/14
USPC .................................................... 257/40
See application file for complete search history.

(56) References Cited

U.S. PATENT DOCUMENTS

| | | | | |
|---|---|---|---|---|
| 8,536,776 | B2* | 9/2013 | Wood | H05B 33/14 313/498 |
| 9,054,330 | B2* | 6/2015 | Qian | H10K 50/115 |
| 9,419,174 | B2* | 8/2016 | Zheng | H05B 33/26 |
| 9,768,404 | B1* | 9/2017 | Steckel | H10K 50/165 |
| 9,893,308 | B2* | 2/2018 | Zhao | H10K 50/125 |
| 10,103,345 | B2* | 10/2018 | Yoon | H10K 50/115 |
| 11,302,883 | B2* | 4/2022 | Rahmati | H01L 33/06 |
| 11,653,512 | B2* | 5/2023 | Lee | H10K 50/11 257/40 |
| 11,758,806 | B2* | 9/2023 | Park | H10K 59/00 |
| 2018/0019427 | A1 | 1/2018 | Kazlas et al. | |
| 2018/0261796 | A1 | 9/2018 | Jang et al. | |

(Continued)

FOREIGN PATENT DOCUMENTS

| | | |
|---|---|---|
| CN | 106450018 A | 2/2017 |
| WO | 2017/094547 A1 | 6/2017 |

*Primary Examiner* — Vu A Vu
(74) *Attorney, Agent, or Firm* — ScienBiziP, P.C.

(57) ABSTRACT

A light-emitting element (2) includes: an anode (4); a hole transport layer (6); a light-emitting layer (8) containing quantum dots (16); an electron transport layer (10); and a cathode (12), arranged in this order, the light-emitting element further including a charge blocking layer (14) either between the light-emitting layer and the hole transport layer or between the light-emitting layer and the electron transport layer or both, wherein the charge blocking layer contains, as an element: a transition metal element that is a component of an oxide semiconductor; at least one selected from Al, Mg, and Si; and O.

20 Claims, 5 Drawing Sheets

(56) References Cited

U.S. PATENT DOCUMENTS

2021/0296618 A1\* 9/2021 Levermore .......... H10K 50/125
2021/0351320 A1\* 11/2021 Ueta ........................ H01L 33/14
2022/0010203 A1\* 1/2022 Stubbs ................... C09K 11/02

\* cited by examiner

LIGHT-EMITTING ELEMENT AND LIGHT-EMITTING DEVICE

TECHNICAL FIELD

The disclosure relates to light-emitting elements containing quantum dots and also to light-emitting devices including such a light-emitting element.

BACKGROUND ART

Patent Literature 1 discloses a light-emitting element including a layer including an insulating material between a carrier injection layer and a light-emitting layer containing quantum dots. This layer including an insulating material restrains the charges injected from one of the electrodes from flowing out to the other electrode without recombining in the light-emitting layer.

CITATION LIST

Patent Literature

Patent Literature 1: US Patent Application Publication US2018/0019427A1

SUMMARY OF INVENTION

Technical Problem

The insulation layer in the light-emitting element of Patent Literature 1 needs to be so thin that the charges injected from an electrode can tunnel through the insulation layer. The insulation layer also needs to be thin from the point of view of reducing increases in the overall resistance of the element. These requirements in the structure of Patent Literature 1 make it difficult to control the thickness of the insulation layer, which leads to a decrease in the yield of the light-emitting element.

Solution to Problem

To address these problems, the disclosure, in an aspect thereof, is directed to a light-emitting element including: an anode; a hole transport layer; a light-emitting layer containing quantum dots; an electron transport layer; and a cathode, arranged in this order, the light-emitting element further including a charge blocking layer either between the light-emitting layer and the hole transport layer or between the light-emitting layer and the electron transport layer or both, wherein the charge blocking layer contains, as an element: a transition metal element that is a component of an oxide semiconductor; at least one selected from Al, Mg, and Si; and O.

To address the problems, the disclosure, in another aspect thereof, is directed to a light-emitting element including: an anode; a hole transport layer; a light-emitting layer containing quantum dots; an electron transport layer; and a cathode, arranged in this order, the light-emitting element further including a charge blocking layer either between the light-emitting layer and the hole transport layer or between the light-emitting layer and the electron transport layer or both, wherein the charge blocking layer contains, as an element: at least one selected from Ni, Cu, Cr, La, Zn, Ti, V, Mo, and W; at least one selected from Al, Mg, and Si; and O.

Advantageous Effects of Invention

The disclosure, in an aspect thereof, can provide a light-emitting element that exhibits improved yield and allows fewer charges to flow out of the light-emitting layer.

DESCRIPTION OF EMBODIMENTS

Embodiment 1

Figure 1A:
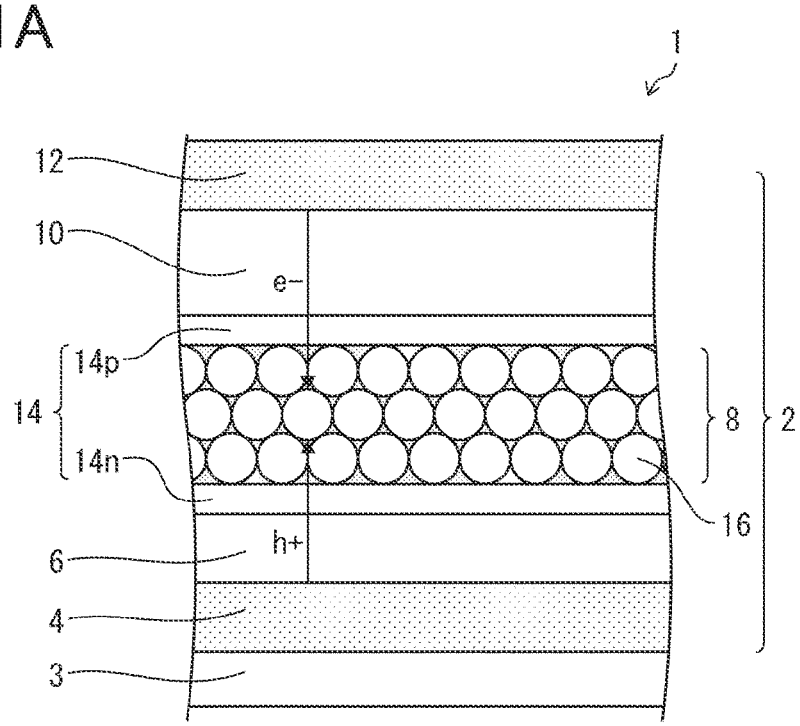
FIG. 1A is a schematic cross-sectional view of a light-emitting device in accordance with Embodiment 1 of the disclosure.
Figure 1B:
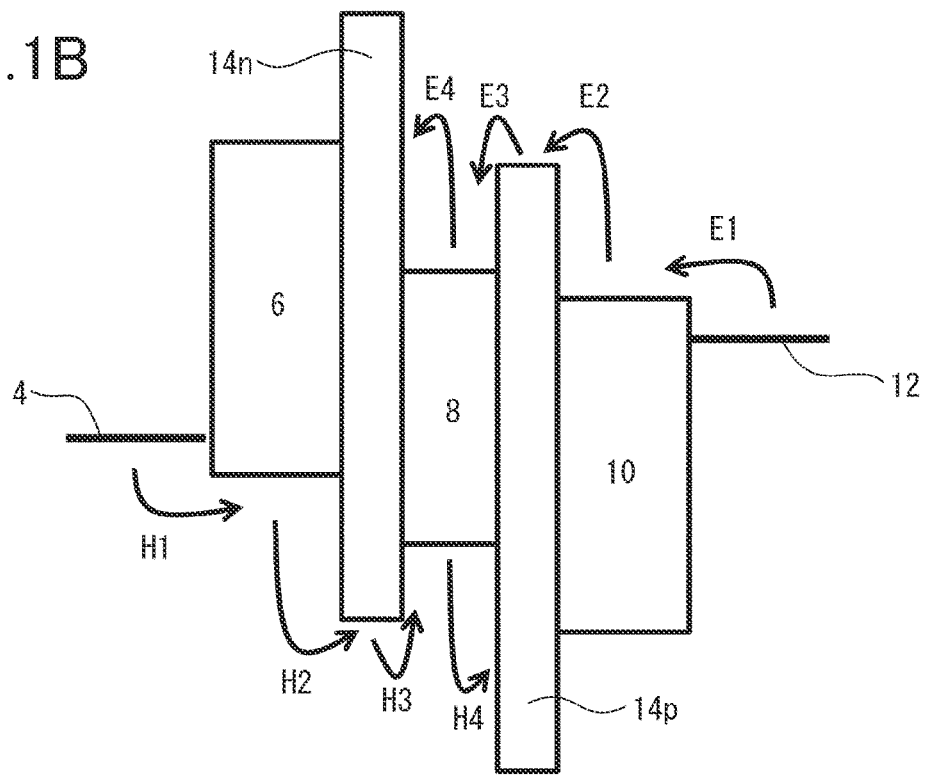
FIG. 1B is an energy diagram showing examples of the Fermi level or the electron affinity and ionization potential of each layer in a light-emitting element in the light-emitting device.

FIG. 1A is a schematic cross-sectional view of a light-emitting device 1 in accordance with the present embodiment. FIG. 1B is an energy band diagram showing examples of the Fermi level or band gap of each layer in a light-emitting element 2 in accordance with the present embodiment.

The light-emitting device 1 in accordance with the present embodiment includes the light-emitting element 2 and an array substrate 3 as shown in FIG. 1A. The light-emitting device 1 has a structure in which the layers that form the light-emitting element 2 are stacked on the array substrate 3 that carries TFTs (thin film transistors, not shown) thereon. The direction from the light-emitting element 2 to the array substrate 3 in the light-emitting device 1 will be referred to as the "downward direction" throughout the present specification. Meanwhile, the direction from the array substrate 3 for the light-emitting element 2 to the light-emitting element 2 will be referred to as the "upward direction" throughout the present specification.

The light-emitting element 2 includes a hole transport layer 6, a light-emitting layer 8, an electron transport layer 10, and a cathode 12 arranged in this order on an anode 4 when viewed from the underlying anode 4. The anode 4 of the light-emitting element 2, provided on the array substrate 3, is electrically connected to one of the TFTs on the array substrate 3. In an alternative embodiment, the light-emitting element may include a cathode on the array substrate and further include an electron transport layer, a light-emitting layer, a hole transport layer, and an anode arranged in this order on the cathode.

The light-emitting element 2 further includes a charge blocking layer 14 in the present embodiment. The charge blocking layer 14 includes an electron blocking layer 14n and a hole blocking layer 14p. The light-emitting element 2 includes the electron blocking layer 14n between the light-emitting layer 8 and the hole transport layer 6 and includes the hole blocking layer 14p between the light-emitting layer 8 and the electron transport layer 10.

The light-emitting element 2, in the present embodiment, includes the charge blocking layer 14 both between the light-emitting layer 8 and the hole transport layer 6 and between the light-emitting layer 8 and the electron transport layer 10. In a light-emitting element in accordance with another embodiment, however, the charge blocking layer 14 may include only either one of the electron blocking layer 14n and the hole blocking layer 14p. In other words, the light-emitting element 2 includes the charge blocking layer 14 either between the light-emitting layer 8 and the hole transport layer 6 or between the light-emitting layer 8 and the electron transport layer 10 or both.

A more detailed description is now given of the structure of the layers in the light-emitting element 2.

The anode 4 and the cathode 12 contain a conductive material and are electrically connected to the hole transport layer 6 and the electron transport layer 10 respectively.

Either the anode 4 or the cathode 12 is a transparent electrode. The transparent electrode may be formed of, for example, ITO, IZO, ZnO, AZO, BZO, or FTO by, for example, sputtering. Either the anode 4 or the cathode 12 may contain a metal material. The metal material is preferably Al, Cu, Au, Ag, or Mg, which exhibits a high reflectance in the visible range, either singly or in combination.

The hole transport layer 6 transports holes from the anode 4 to the light-emitting layer 8. The hole transport layer 6 contains a p-type semiconductor material in the present embodiment. The hole transport layer 6 preferably contains an inorganic material from the point of view of securing sufficient carrier concentration and carrier mobility and also from the point of view of alleviating degradation due to, for example, moisture. The hole transport layer 6 in particular contains a semiconductor material such as an oxide in the present embodiment. Specifically, as an example, the hole transport layer 6 contains an oxide of any of Ni, Cu, and Cr or a mixture of these. The hole transport layer 6 may contain a material prepared by adding Li or La to such a material.

The electron transport layer 10 transports electrons from the cathode 12 to the light-emitting layer 8. The electron transport layer 10 contains a n-type semiconductor material in the present embodiment. Similarly to the hole transport layer 6, the electron transport layer 10 preferably contains an inorganic material from the point of view of securing sufficient carrier concentration and carrier mobility and also from the point of view of alleviating degradation due to, for example, moisture. Similarly again to the hole transport layer 6, the electron transport layer 10 in particular contains a semiconductor material such as an oxide in the present embodiment. Specifically, the electron transport layer 10 contains a chalcogenide of any of Zn, Ti, In, Ga, Sn, V, Mo, and W or a mixture of these.

The material for the hole transport layer 6 and the electron transport layer 10 may be partially oxygen deficient in the present embodiment. The hole transport layer 6 and the electron transport layer 10 may contain a small amount of dopant like typical charge transport layers.

The light-emitting layer 8 contains quantum dots (semiconductor nanoparticles) 16. The light-emitting layer 8 may include a stack of light-emitting layers. The quantum dots 16 are not necessarily arranged regularly in the light-emitting layer 8 as shown in FIG. 1A and may be disordered in the light-emitting layer 8. The light-emitting layer 8 can be formed of a dispersion solution containing the quantum dots 16 dispersed in a medium such as hexane or toluene, by spin-coating or inkjet printing. The dispersion solution may additionally contain a dispersant such as thiol or amine. The light-emitting layer 8 preferably has a thickness of 2 to 70 nm.

The quantum dots 16 have a valence band and a conduction band and emit light when the holes in the valence band and the electrons in the conduction band recombine. The emission from the quantum dots 16 has a narrow spectrum due to the quantum confinement effect and hence exhibits a relatively deep chromaticity.

The quantum dots 16 may contain any suitably chosen material used in the field of technology. The quantum dots 16 may have, for example, a core/shell structure including a core and a shell surrounding the core. The light-emitting layer 8 may further contain ligands coordinately bonded to the outermost layers of the quantum dots 16.

The quantum dots 16 have a particle diameter of approximately 2 to 15 nm. The wavelength of the emission from the quantum dots 16 is controllable through the particle diameter of the quantum dots 16. Therefore, the wavelength of the light emitted by the light-emitting device 1 can be controlled by controlling the particle diameter of the quantum dots 16.

The charge blocking layer 14 has a function of preventing the charges transported from one of the electrodes to the light-emitting layer 8 from flowing out to the other electrode without recombining in the light-emitting layer 8. Specifically, each charge blocking layer 14 inhibits charge transport by inhibiting the transport of the carriers injected from an electrode, that is, only either the holes injected from the anode 4 or the electrons injected from the cathode 12.

For example, the hole blocking layer 14p inhibits the transport of holes so that the holes transported from the anode 4 to the light-emitting layer 8 via the hole transport layer 6 do not flow out to the cathode 12 via the electron transport layer 10. The hole blocking layer 14p preferably does not inhibit the electrons transported from the cathode 12 to the electron transport layer 10 from being further transported to the light-emitting layer 8.

Meanwhile, the electron blocking layer 14n inhibits the transport of electrons so that the electrons transported from the cathode 12 to the light-emitting layer 8 via the electron transport layer 10 do not flow out to the anode 4 via the hole transport layer 6. The electron blocking layer 14n preferably does not inhibit the holes transported from the anode 4 to the hole transport layer 6 from being further transported to the light-emitting layer 8.

The charge blocking layer 14 contains, as an element: a transition metal element that is a component of an oxide semiconductor; an element that is a component of an oxide insulator; and oxygen.

The "transition metal element that is a component of an oxide semiconductor" refers to the transition metal element that becomes a semiconductor when oxidized. The charge blocking layer 14 may contain at least one selected from Ni, Cu, Cr, La, Zn, Ti, V, Mo, and W as a transition metal element.

The "element that is a component of an oxide insulator" refers to the element that becomes an insulator when oxidized. The charge blocking layer 14 contains at least one selected from Al, Mg, and Si as an element that is a component of an oxide insulator.

Since the charge blocking layer 14 contains a mixture of a material that is a component of an oxide semiconductor and a material that is a component of an oxide insulator, the charge blocking layer 14 provides a semiconductor layer in which the carrier density is reduced. In the present embodiment, the charge blocking layer 14 contains an oxide of a semiconductor in which the carrier density is reduced.

The electron blocking layer 14n may contain Ni, Mg, and O as an element in the present embodiment. When this is the case, the electron blocking layer 14n contains, for example, $Mg_xNi_{1-x}O$ where x is a real number in the range of $0<x<1$. The hole blocking layer 14p may contain Zn, Mg, and O as an element in the present embodiment. When this is the case, the electron blocking layer 14n contains, for example, $Mg_yZn_{1-y}O$ where y is a real number in the range of $0<y<1$.

The hole transport layer 6, the electron transport layer 10, and the charge blocking layer 14 may be formed by sputtering.

The hole transport layer 6 and the electron blocking layer 14n may be formed by sputtering. As an example, the hole transport layer 6 and the electron blocking layer 14n may be formed by sputtering NiO and then starting running a Mg sputtering device while the NiO sputtering is still on to simultaneously sputter NiO and Mg. This particular process enables successive formation of the NiO-containing hole transport layer 6 and the $Mg_xNi_{1-x}O$-containing electron blocking layer 14n.

As described above, the electron blocking layer 14n preferably contains, as a component element thereof, the same element with at least one of the component elements of the hole transport layer 6 in order to form the hole transport layer 6 and the electron blocking layer 14n by successive sputtering. The hole transport layer 6 and the electron blocking layer 14n may alternatively be formed individually by sputtering. When this is the case, the hole transport layer 6 and the electron blocking layer 14n may contain different component elements.

The electron transport layer 10 and the hole blocking layer 14p may be formed successively by sputtering. As an example, the electron transport layer 10 and the hole blocking layer 14p may be formed by sputtering ZnO and Mg and then stopping running the Mg sputtering device halfway through the ZnO and Mg sputtering to only sputter ZnO. This particular process enables successive formation of the ZnO-containing electron transport layer 10 and the $Mg_yZn_{1-y}O$-containing hole blocking layer 14p.

As described above, the hole blocking layer 14p preferably contains, as a component element thereof, the same element with at least one of the component elements of the electron transport layer 10 in order to form the electron transport layer 10 and the hole blocking layer 14p by successive sputtering. The electron transport layer 10 and the hole blocking layer 14p may alternatively be formed individually by sputtering or another one of publicly known, conventional thin film forming techniques. When this is the case, the electron transport layer 10 and the hole blocking layer 14p may contain different component elements.

Next will be described the energy bands of the layers in the light-emitting element 2 in accordance with the present embodiment with reference to FIG. 1B. FIG. 1B is an energy band diagram showing examples of the Fermi level or band gap of each layer in the light-emitting element 2 in accordance with the present embodiment.

The energy band diagrams in the present specification show the energy level of each layer relative to the vacuum energy level thereof. The energy band diagrams in the present specification also show numerals indicating the specific members in which the Fermi level or energy level occurs. The Fermi level is shown for the anode 4 and the cathode 12. The band gap from the electron affinity to the ionization potential is shown for the hole transport layer 6, the light-emitting layer 8, the electron transport layer 10, and the charge blocking layer 14.

In the present embodiment, as an example, when the hole transport layer 6 contains NiO, the hole transport layer 6 exhibits an ionization potential of approximately 5.2 eV and an electron affinity of approximately 2.0 eV. In the present embodiment, as an example, when the electron transport layer 10 contains ZnO, the electron transport layer 10 exhibits an ionization potential of approximately 7.0 eV and an electron affinity of approximately 3.8 eV. The light-emitting layer 8 exhibits an ionization potential of approximately 5.0 eV to 7.0 eV and an electron affinity of approximately 2.0 eV to 3.5 eV. These figures may vary depending on the material and particle diameter of the quantum dots 16.

The charge blocking layer 14 contains a mixture of a transition metal element that is a component of an oxide semiconductor and an element that is a component of an oxide insulator. The charge blocking layer 14 therefore usually has a greater band gap than does a charge blocking layer made of an oxide semiconductor alone. In particular, the electron blocking layer 14n has a greater band gap than does the hole transport layer 6, and the hole blocking layer 14p has a greater band gap than does the electron transport layer 10 in the present embodiment, as shown in (b) of FIG. 1B.

A description is now given of the emission mechanism of the light-emitting device 1 in accordance with the present embodiment with reference to FIG. 1.

When a potential difference is applied across the anode 4 and the cathode 12 of the light-emitting device 1, holes are injected from the anode 4 to the light-emitting layer 8, and electrons are injected from the cathode 12 to the light-emitting layer 8. The holes from the anode 4 pass through the hole transport layer 6 and the electron blocking layer 14n and reach the light-emitting layer 8 as indicated by arrow h+ in FIG. 1A. The electrons from the cathode 12 pass through the electron transport layer 10 and the hole blocking layer 14p and reach the light-emitting layer 8 as indicated by arrow e− in FIG. 1A.

Having reached the light-emitting layer 8, the holes and electrons recombine in the quantum dots 16, thereby emitting light. The emission from the quantum dots 16 may, for example, reflect off the anode 4 which is a metal electrode, travel through the cathode 12 which is a transparent electrode, and emit out of the light-emitting device 1. In an alternative embodiment, the emission from the quantum dots 16 may, for example, reflect off the cathode 12 which is a metal electrode, travel through the anode 4 which is a transparent electrode and the array substrate 3, and emit out of the light-emitting device 1.

A description is now given of hole and electron transport in the layers in the light-emitting element 2 with reference to FIG. 1B.

As a potential difference develops between the anode 4 and the cathode 12 in the light-emitting device 1, holes are injected from the anode 4 to the hole transport layer 6 as indicated by arrow H1 in FIG. 1B, and similarly, electrons are injected from the cathode 12 to the electron transport layer 10 as indicated by arrow E1 in FIG. 1B.

Holes are then injected from the hole transport layer 6 to the electron blocking layer 14n as indicated by arrow H2 in FIG. 1B. Since the electron blocking layer 14n is not a pure oxide insulator, but contains an element that forms a p-type oxide semiconductor, the electron blocking layer 14n contains carriers therein, albeit in low density, in this situation. The holes injected to the electron blocking layer 14n can hence be transported in the electron blocking layer 14n toward the light-emitting layer 8. The holes in the electron blocking layer 14n are therefore injected to the light-emitting layer 8 as indicated by arrow H3 in FIG. 1B.

The electron blocking layer 14n has a greater band gap than does the hole transport layer 6 and a greater ionization potential than does the hole transport layer 6 in this situation.

The barrier in injecting holes from the electron blocking layer 14n to the light-emitting layer 8 is therefore lower than the barrier in directly injecting holes from the hole transport layer 6 to the light-emitting layer 8. The present embodiment therefore exhibits increased efficiency in transporting holes from the anode 4 to the light-emitting layer 8, which in turn leads to an increased hole concentration in the light-emitting layer 8.

The electron blocking layer 14n contains an element that forms a p-type oxide semiconductor. The electron blocking layer 14n hence allows the carriers (holes) intended to be injected to the light-emitting layer 8 to move therethrough more easily than the carriers (electrons) intended to be inhibited from moving therethrough, in comparison with an electron blocking layer made of an insulation material alone. Therefore, the electron blocking layer 14n has both a high-efficiency hole injection function and a high-efficiency electron blocking function.

Electrons are similarly injected from the electron transport layer 10 to the hole blocking layer 14p as indicated by arrow E2 in FIG. 1B. Since the hole blocking layer 14p is not a pure oxide insulator, but contains an element that forms a n-type oxide semiconductor, the hole blocking layer 14p contains carriers therein, albeit in low density, in this situation. The electrons injected to the hole blocking layer 14p can hence be transported in the hole blocking layer 14p toward the light-emitting layer 8. The electrons in the hole blocking layer 14p are therefore injected to the light-emitting layer 8 as indicated by arrow E3 in FIG. 1B.

The hole blocking layer 14p has a greater band gap than does the electron transport layer 10 and a lower electron affinity than does the electron transport layer 10 in this situation.

The barrier in injecting electrons from the hole blocking layer 14p to the light-emitting layer 8 is therefore lower than the barrier in directly injecting electrons from the electron transport layer 10 to the light-emitting layer 8. The present embodiment therefore exhibits increased efficiency in transporting electrons from the cathode 12 to the light-emitting layer 8, which in turn leads to an increased electron concentration in the light-emitting layer 8.

The hole blocking layer 14p contains an element that forms a n-type oxide semiconductor. The hole blocking layer 14p hence allows the carriers (electrons) intended to be injected to the light-emitting layer 8 to move therethrough more easily than the carriers (holes) intended to be inhibited from moving therethrough, in comparison with an hole blocking layer made of an insulation material alone. Therefore, the hole blocking layer 14p has both a high-efficiency electron injection function and a high-efficiency hole blocking function.

The holes and electrons transported to the light-emitting layer 8 recombine in the quantum dots 16 as described above, the quantum dots 16 thereby emitting light.

The value that remains when the electron affinity of the electron blocking layer 14n is subtracted from the electron affinity of the light-emitting layer 8 is an equivalent of the barrier in injecting, from the light-emitting layer 8 to the electron blocking layer 14n, the electrons transported to the light-emitting layer 8. The electron affinity of the electron blocking layer 14n is lower than the electron affinity of the hole transport layer 6.

The barrier in injecting holes from the light-emitting layer 8 to the electron blocking layer 14n, which is indicated by arrow H4 in FIG. 1B, is therefore higher than the barrier in directly injecting electrons from the light-emitting layer 8 to the hole transport layer 6. The electron blocking layer 14n hence more efficiently inhibits electrons from flowing out from the light-emitting layer 8 to the hole transport layer 6 in the present embodiment, which in turn leads to an increased electron concentration in the light-emitting layer 8.

The electron affinity of the electron blocking layer 14n is preferably lower than the electron affinity of the light-emitting layer 8 by at least 1.0 eV. In such a structure, the electron blocking layer 14n is capable of sufficiently restraining the electrons transported to the light-emitting layer 8 from flowing out to the hole transport layer 6.

Likewise, the value that remains when the ionization potential of the light-emitting layer 8 is subtracted from the ionization potential of the hole blocking layer 14p is an equivalent of the barrier in injecting, from the light-emitting layer 8 to the hole blocking layer 14p, the holes transported to the light-emitting layer 8. The ionization potential of the hole blocking layer 14p is higher than the ionization potential of the electron transport layer 10.

The barrier in injecting holes from the light-emitting layer 8 to the hole blocking layer 14p, which is indicated by arrow E4 in FIG. 1B, is therefore higher than the barrier in directly injecting holes from the light-emitting layer 8 to the electron transport layer 10. The hole blocking layer 14p hence more efficiently inhibits holes from flowing out from the light-emitting layer 8 to the electron transport layer 10 in the present embodiment, which in turn leads to an increased hole concentration in the light-emitting layer 8.

The ionization potential of the hole blocking layer 14p is preferably higher than the ionization potential of the light-emitting layer 8 by at least 1.0 eV. In such a structure, the hole blocking layer 14p is capable of sufficiently restraining the holes transported to the light-emitting layer 8 from flowing out to the electron transport layer 10.

The electron blocking layer 14n and the hole blocking layer 14p increase hole and electron concentrations in the light-emitting layer 8 as described above. The holes and electrons in the light-emitting layer 8 therefore efficiently recombine. The electron blocking layer 14n and the hole blocking layer 14p hence improves the light-emitting efficiency of the light-emitting element 2 in the present embodiment.

To improve the electron transport inhibition function of the electron blocking layer 14n and the hole transport inhibition function of the hole blocking layer 14p, it is preferable to increase the band gaps of the electron blocking layer 14n and the hole blocking layer 14p. Increasing the band gaps of the electron blocking layer 14n and the hole blocking layer 14p is also preferable from the point of view of improving the efficiency of hole injection from the electron blocking layer 14n to the light-emitting layer 8 and the efficiency of electron injection from the hole blocking layer 14p to the light-emitting layer 8.

A detailed description is now given of the relationship between the band gap of the charge blocking layer 14 and the ratio of the element that is a component of an oxide insulator in the charge blocking layer 14 with reference to FIG. 2, by taking the $Mg_xNi_{1-x}O$-containing electron blocking layer 14n as an example.

Figure 2A:
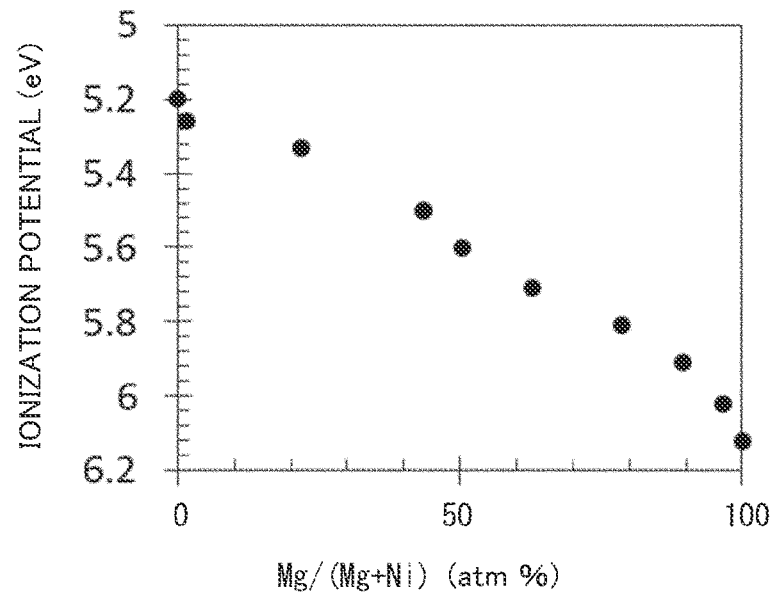
FIG. 2A is a graph representing a relationship between the ionization potential of an electron blocking layer in accordance with Embodiment 1 of the disclosure and the ratio of a transition metal element that is a component of an oxide insulator in the electron blocking layer.
Figure 2B:
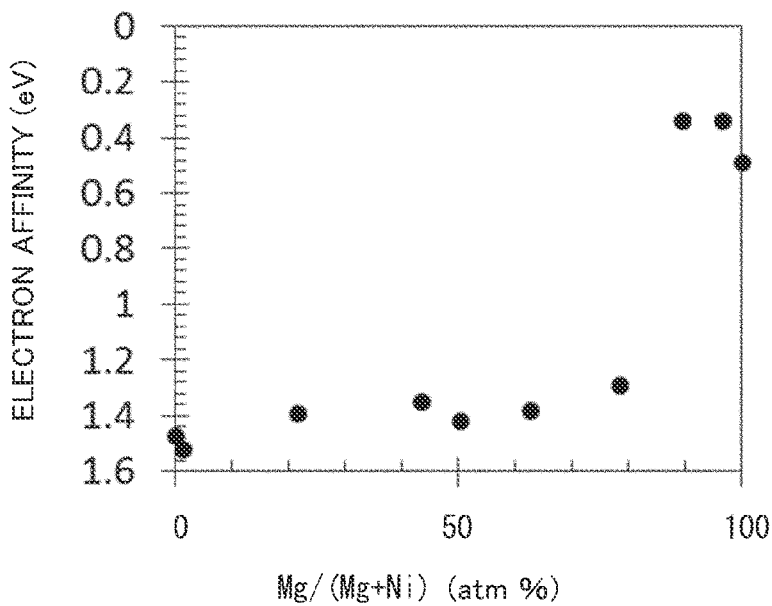
FIG. 2B is a graph representing a relationship between the electron affinity of the electron blocking layer in accordance with Embodiment 1 of the disclosure and the ratio of a transition metal element that is a component of an oxide insulator in the electron blocking layer.

The horizontal axis in FIG. 2A and FIG. 2B indicates the ratio of the total Mg atom count to the sum of the total Mg atom count and the total Ni atom count in all the non-oxygen elements present in the electron blocking layer 14n. In other words, the horizontal axis in FIG. 2A and FIG. 2B indicates, in units of atomic percent, the ratio of the element that is a component of an oxide insulator to the non-oxygen elements in the electron blocking layer 14n. In FIG. 2A and FIG. 2B, the ionization potential of the electron blocking layer 14n is plotted on the vertical axis of FIG. 2A, and the electron affinity of the electron blocking layer 14n is plotted on the vertical axis of FIG. 2B.

FIG. 2A and FIG. 2B show that the ionization potential increases, and the electron affinity decreases, with an increase in the ratio of Mg, that is, the element that is a component of an oxide insulator, in the electron blocking layer 14n. In other words, the band gap increases with an increase in the ratio of the element that is a component of an oxide insulator in the electron blocking layer 14n.

In particular, when the ratio of Mg in the electron blocking layer 14n, that is, the ratio of the element that is a component of an oxide insulator, exceeds 90 at %, the electron affinity decreases abruptly as shown in (a) and FIG. 2A and FIG. 2B.

It is therefore preferable that the electron blocking layer 14n contain at least 90 at % Mg, that is, the element that is a component of an oxide insulator, relative to the non-oxygen elements from the point of view of efficiently increasing the band gap of the electron blocking layer 14n. The electron blocking layer 14n is not a pure insulator and contains at least a transition metal element that is a component of an oxide semiconductor in the present embodiment. Taking this point into account, the electron blocking layer 14n contains the element that is a component of an oxide insulator in less than 100 at % relative to the non-oxygen elements in the present embodiment.

The relationship between the band gap of the hole blocking layer 14p and the ratio of the element that is a component of an oxide insulator to the non-oxygen elements in the hole blocking layer 14p has a tendency similar to that of such a relationship in the electron blocking layer 14n. It is therefore preferable that the hole blocking layer 14p contain at least 90 at %, but less than 100 at %, Mg, that is, the element that is a component of an oxide insulator, relative to the non-oxygen elements.

The charge blocking layer 14, in the present embodiment, restrains the charges injected from one of the electrodes from flowing out to the other electrode without recombining in the light-emitting layer 8, which improves the light-emitting efficiency of the light-emitting element 2.

The charge blocking layer 14 is not a pure oxide insulator and contains a transition metal element that is a component of an oxide semiconductor. The charge blocking layer 14 therefore contains carriers therein, albeit in low density, and for this reason does not completely block the charges injected from one of the electrodes and is capable of transporting the charges to the light-emitting layer 8.

The charge blocking layer 14 therefore does not need to allow tunneling of the charges and may have some minimum thickness. That facilitates the control of the thickness of the charge blocking layer 14 and increases the yield of the light-emitting element 2.

The thickness of the charge blocking layer 14 is preferably at least 3 nm and more preferably at least 4 nm, from the point of view of more reliable control of the thickness of the charge blocking layer 14. The thickness of the charge blocking layer 14 is preferably no more than 30 nm and more preferably no more than 15 nm, from the point of view of reducing the overall resistance of the light-emitting element 2.

The present embodiment has been described so far by taking the NiO-containing hole transport layer 6 as an example. This is by no means intended to limit the scope of the disclosure. Alternatively, the hole transport layer 6 may contain, for example, Mg, that is, the element included as an element that is a component of an oxide insulator in the electron blocking layer 14n. When this is the case, the hole transport layer 6 preferably contains an element that is a component of an oxide insulator in a ratio lower than the ratio of the element in the electron blocking layer 14n. This particular composition can maintain the band gap of the hole transport layer 6 at a level lower than the band gap of the electron blocking layer 14n.

The inclusion in the hole transport layer 6 of a small amount of the element that is a component of an oxide insulator slightly increases the band gap of the hole transport layer 6 and also increases the ionization potential of the hole transport layer 6. That in turn lowers the barrier in injecting holes from the hole transport layer 6 to the electron blocking layer 14n, thereby further improving the efficiency of hole transport from the anode 4 to the light-emitting layer 8.

The present embodiment has been described so far by taking the ZnO-containing electron transport layer 10 as an example. This is by no means intended to limit the scope of the disclosure. Alternatively, the electron transport layer 10 may contain, for example, Mg, that is, the element included as an element that is a component of an oxide insulator in the hole blocking layer 14p. When this is the case, the electron transport layer 10 preferably contains an element that is a component of an oxide insulator in a ratio lower than the ratio of the element in the hole blocking layer 14p. This particular composition can maintain the band gap of the electron transport layer 10 at a level lower than the band gap of the hole blocking layer 14p.

The inclusion in the electron transport layer 10 of a small amount of the element that is a component of an oxide insulator slightly increases the band gap of the electron transport layer 10 and decreases the electron affinity of the electron transport layer 10. That in turn lowers the barrier in injecting electrons from the electron transport layer 10 to the hole blocking layer 14p, thereby further improving the efficiency of electron transport from the cathode 12 to the light-emitting layer 8.

There may be further provided a hole injection layer (not shown) between the anode 4 and the hole transport layer 6 in the present embodiment, to efficiently inject holes from the anode 4 to the hole transport layer 6. The hole transport layer may be made of an organic or inorganic conductor material or a p- or n-type semiconductor material. Specifically, for example, the hole transport layer may be made of an organic material such as PEDOT:PSS or HAT-CN or an oxide of, for example, Mo, Wo, or V. The description in this paragraph is similarly applicable to any of the following embodiments.

Embodiment 2

Figure 3A:
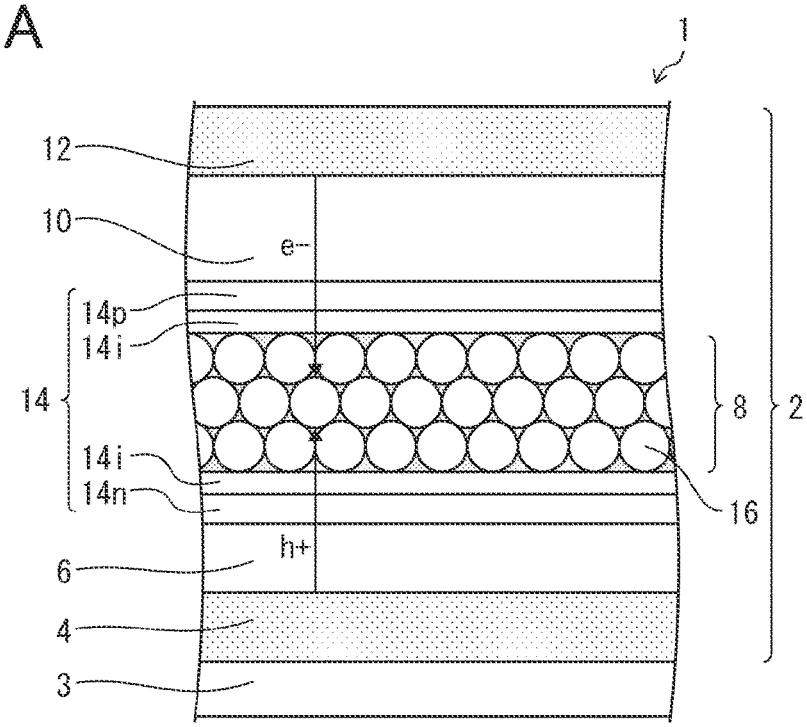
FIG. 3A is a schematic cross-sectional view of a light-emitting device in accordance with Embodiment 2 of the disclosure.
Figure 3B:
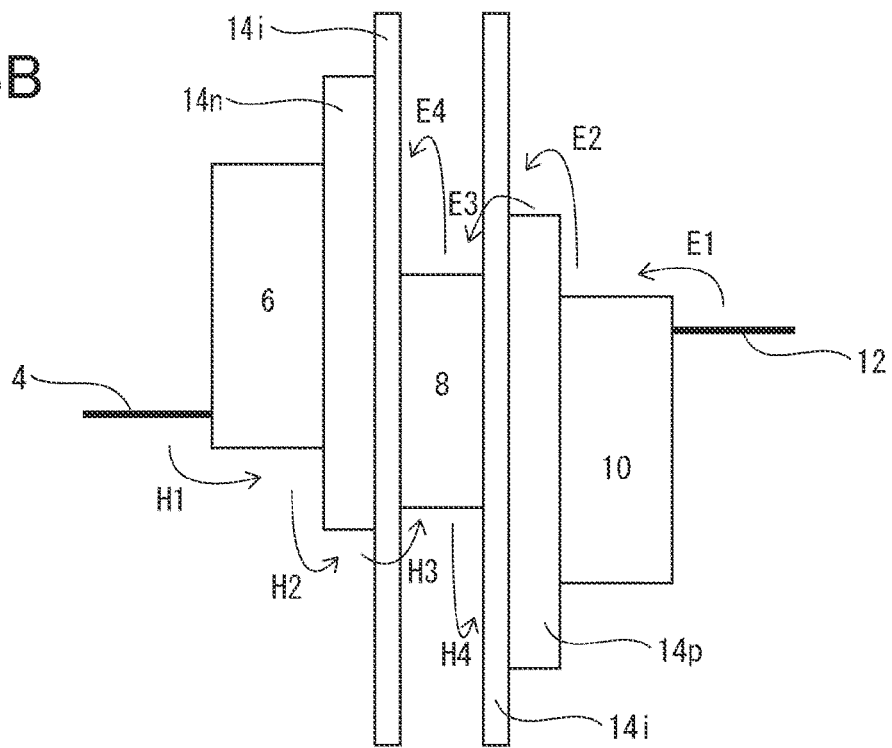
FIG. 3B is an energy diagram showing examples of the Fermi level or the electron affinity and ionization potential of each layer in a light-emitting element in the light-emitting device.

FIG. 3A is a schematic cross-sectional view of a light-emitting device 1 in accordance with the present embodiment. FIG. 3B is an energy band diagram showing examples of the Fermi level or band gap of each layer in a light-emitting element 2 in accordance with the present embodiment.

The light-emitting device 1 in accordance with the present embodiment has the same structure as the light-emitting device 1 in accordance with the preceding embodiment, except that the former further includes an insulation layer 14i between the light-emitting layer 8 and each charge blocking layer 14 as shown in FIG. 3A.

The insulation layer 14i may be, for example, an oxide insulator and may be an oxide of the element that is a component of an oxide insulator in either charge blocking layer 14. In other words, the insulation layer 14i may be, for example, MgO in the present embodiment. The insulation layer 14i is thinner the charge blocking layer 14 and has a thickness of, for example, approximately 1 nm to 2 nm. The insulation layer 14i has a greater band gap than does the charge blocking layer 14 as shown in FIG. 3B.

Holes and electrons may be transported between the layers in the light-emitting element 2 by the same mechanism in the present embodiment as the mechanism described in the preceding embodiment, except for the transport from each charge blocking layer 14 to the light-emitting layer 8.

The holes in the electron blocking layer 14n are injected to the light-emitting layer 8 via the insulation layer 14i as indicated by arrow H3 in FIG. 3B in the present embodiment. The insulation layer 14i is sufficiently thin that holes can tunnel through the insulation layer 14i to the light-emitting layer 8. The insulation layer 14i also has a sufficiently large band gap to further restrain hole injection from the light-emitting layer 8 to the hole blocking layer 14p indicated by arrow H4 in FIG. 3B. The insulation layer 14i thus further contributes to increases in hole concentration in the light-emitting layer 8.

The electrons in the hole blocking layer 14p are injected likewise to the light-emitting layer 8 via the insulation layer 14i as indicated by arrow E3 in FIG. 3B. The insulation layer 14i is sufficiently thin that electrons can tunnel through the insulation layer 14i to the light-emitting layer 8. The insulation layer 14i also has a sufficiently large band gap to further restrain electron injection from the light-emitting layer 8 to the electron blocking layer 14n indicated by arrow E4 in FIG. 3B. The insulation layer 14i thus further contributes to increases in electron concentration in the light-emitting layer 8.

The insulation layer 14i improves the light-emitting efficiency of the light-emitting element 2 in accordance with the present embodiment as described here. The insulation layer 14i is not necessarily uniform in the present embodiment. For instance, the insulation layer 14i may be so thin in some locations that charges can easily flow out in those location. Even then, the charge blocking layer 14 is still capable of restraining charges from flowing out through the locations. Therefore, even when the insulation layer 14i is not formed properly, the light-emitting element 2 will unlikely be entirely defective, thereby maintaining the yield thereof.

Embodiment 3

Figure 4A:
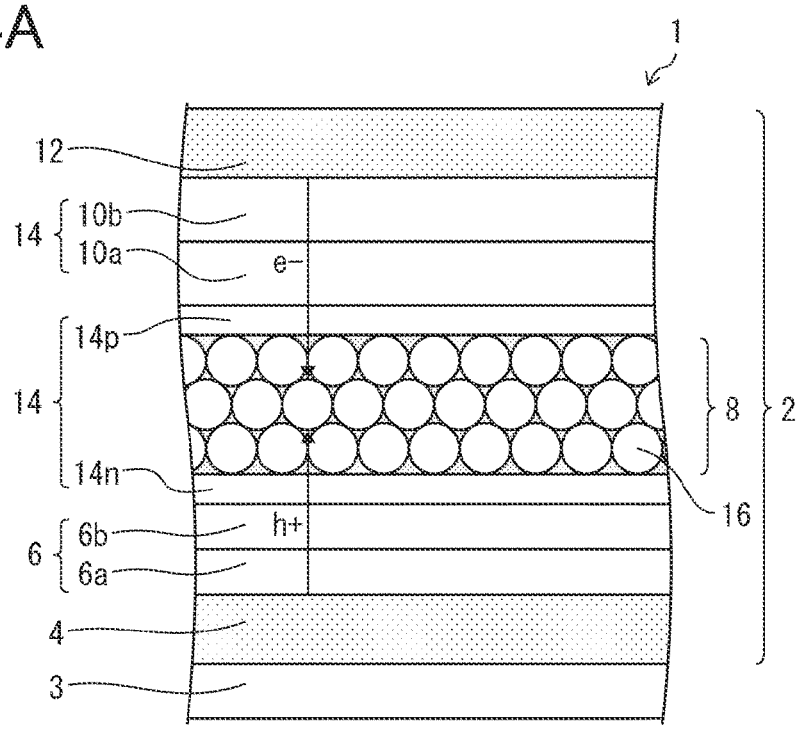
FIG. 4A is a schematic cross-sectional view of a light-emitting device in accordance with Embodiment 3 of the present invention disclosure.
Figure 4B:
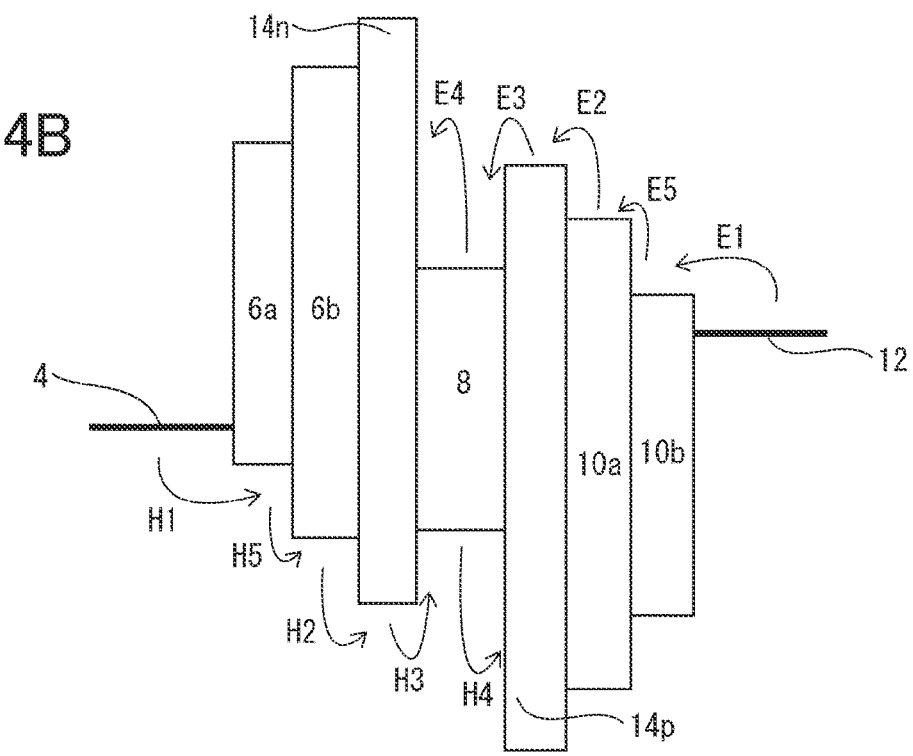
FIG. 4B is an energy diagram showing examples of the Fermi level or the electron affinity and ionization potential of each layer in a light-emitting element in the light-emitting device.

FIG. 4A is a schematic cross-sectional view of a light-emitting device 1 in accordance with the present embodiment. FIG. 4B is an energy band diagram showing examples of the Fermi level or band gap of each layer in a light-emitting element 2 in accordance with the present embodiment.

In the light-emitting device 1 in accordance with the present embodiment, the hole transport layer 6 includes a first hole transport layer 6a and a second hole transport layer 6b in this order when viewed from the anode 4 as shown in FIG. 4A. Additionally, in the light-emitting device 1 in accordance with the present embodiment, the electron transport layer 10 includes a first electron transport layer 10a and a second electron transport layer 10b in this order when viewed from the hole blocking layer 14p as shown in FIG. 4A. Apart from these differences, the light-emitting device 1 in accordance with the present embodiment may have the same structure as the light-emitting device 1 in accordance with Embodiment 1.

The first hole transport layer 6a has a smaller band gap than does the second hole transport layer 6b in the present embodiment. The band gap can hence be safely regarded as gradually increasing across the hole transport layer 6 from the end face thereof facing the anode 4 to the end face thereof facing the light-emitting layer 8 in the present embodiment. Therefore, in particular, the first hole transport layer 6a has a lower ionization potential than does the second hole transport layer 6b in the present embodiment.

The second hole transport layer 6b may contain a small amount of the element that is a component of an oxide insulator in the electron blocking layer 14n. The hole transport layer 6 in accordance with the present embodiment can be obtained by adjusting the density of the element in the second hole transport layer 6b to fall between the density of the element in the first hole transport layer 6a and the density of the element in the electron blocking layer 14n.

The first hole transport layer 6a may be, for example, NiO, the second hole transport layer 6b may be, for example, $Mg_{x1}Ni_{1-x1}O$, and the electron blocking layer 14n may be, for example, $Mg_{x2}Ni_{1-x2}O$, in the present embodiment, where x1 and x2 are real numbers in the range of 0<x1<x2<1. This particular composition enables successive formation of the first hole transport layer 6a, the second hole transport layer 6b, and the electron blocking layer 14n by sputtering as described earlier.

The first electron transport layer 10a has a greater band gap than does the second electron transport layer 10b in the present embodiment. The band gap can hence be safely regarded as gradually increasing across the electron transport layer 10 from the end face thereof facing the cathode 12 to the end face thereof facing the light-emitting layer 8 in the present embodiment. Therefore, in particular, the first electron transport layer 10a has a lower electron affinity than does the second electron transport layer 10b in the present embodiment.

The first electron transport layer 10a may contain a small amount of the element that is a component of an oxide insulator in the hole blocking layer 14p. The electron transport layer 10 in accordance with the present embodiment can be obtained by adjusting the density of the element in the first electron transport layer 10a to fall between the density of the element in the second electron transport layer 10b and the density of the element in the hole blocking layer 14p.

The second electron transport layer 10b may be, for example, ZnO, the first electron transport layer 10a may be, for example, $Mg_{y1}Zn_{1-y1}O$, and the hole blocking layer 14p may be, for example, $Mg_{y2}Zn_{1-y2}O$ in the present embodiment, where y1 and y2 are real numbers in the range of 0<y1<y2<1. This particular composition enables successive formation of the hole blocking layer 14p, the first electron transport layer 10a, and the second electron transport layer 10b by sputtering as described earlier.

Holes and electrons may be transported between the layers in the light-emitting element 2 by the same mechanism in the present embodiment as the mechanism described in Embodiment 1, except for the transport of carriers in the hole transport layer 6 and the electron transport layer 10.

The present embodiment presents a barrier in injecting holes from the first hole transport layer 6a to the second hole transport layer 6b indicated by arrow H5 in FIG. 4B in the transport of holes in the hole transport layer 6. This barrier in hole injection indicated by arrow H5 in the present embodiment however is lower than the barrier in hole injection indicated by arrow H2 in the preceding embodiments because the second hole transport layer 6b has a higher ionization potential than does the first hole transport layer 6a. The barrier in hole injection indicated by arrow H2 in the present embodiment is lower than the barrier in hole injection indicated by arrow H2 in the preceding embodiments for similar reasons.

The light-emitting element 2 in the present embodiment is therefore capable of lowering the barrier in transporting holes from the hole transport layer 6 to the electron blocking layer 14n without affecting hole transport in the hole transport layer 6 as much as the light-emitting element 2 in the preceding embodiments does. The light-emitting element 2 in the present embodiment hence improves the efficiency of hole transport from the anode 4 to the electron blocking layer 14n, which in turn leads to an increased hole concentration in the light-emitting layer 8.

The present embodiment presents a barrier in injecting electrons from the second electron transport layer 10b to the first electron transport layer 10a indicated by arrow E5 in FIG. 4B in the transport of electrons in the electron transport layer 10. This barrier in electron injection indicated by arrow E5 in the present embodiment however is lower than the barrier in electron injection indicated by arrow E2 in the preceding embodiments because the first electron transport layer 10a has a lower electron affinity than the second electron transport layer 10b. The barrier in electron injection indicated by arrow E2 in the present embodiment is lower than the barrier in electron injection indicated by arrow E2 in the preceding embodiments for similar reasons.

The light-emitting element 2 in the present embodiment is therefore capable of lowering the barrier in transporting electrons from the electron transport layer 10 to the hole blocking layer 14p without affecting electron transport in the electron transport layer 10 as much as the light-emitting element 2 in the preceding embodiments does. The light-emitting element 2 in the present embodiment hence improves the efficiency of electron transport from the cathode 12 to the hole blocking layer 14p, which in turn leads to an increased electron concentration in the light-emitting layer 8.

Embodiment 4

Figure 5A:
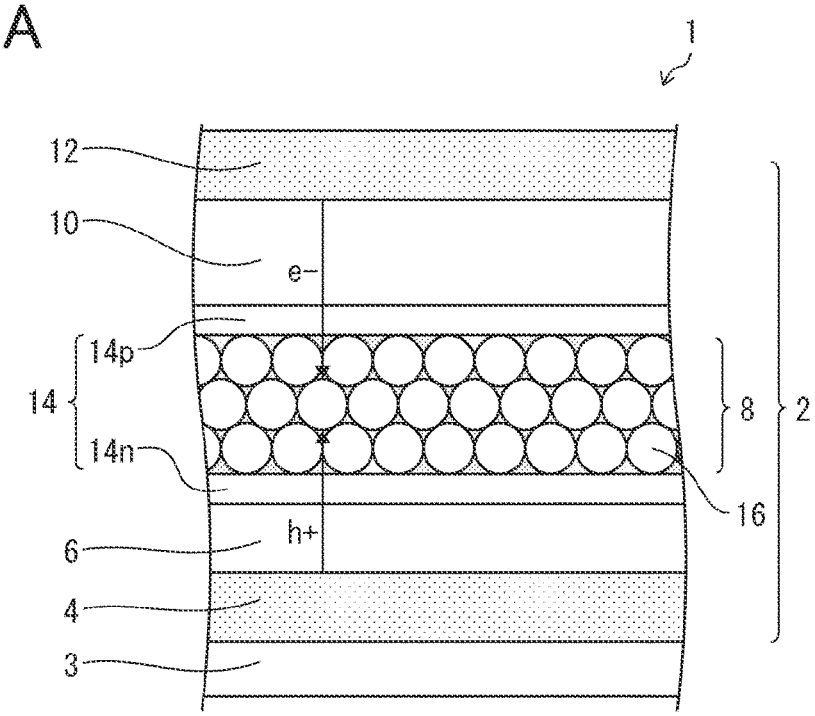
FIG. 5A is a schematic cross-sectional view of a light-emitting device in accordance with Embodiment 4 of the present invention disclosure.
Figure 5B:
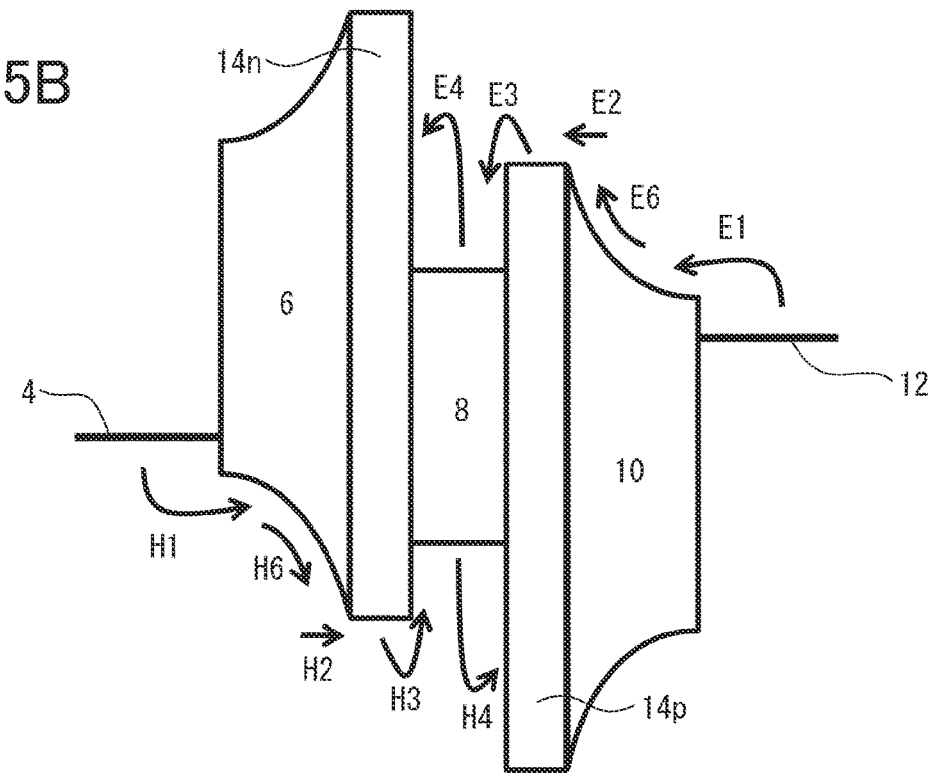
FIG. 5B is an energy diagram showing examples of the Fermi level or the electron affinity and ionization potential of each layer in a light-emitting element in the light-emitting device.

FIG. 5A is a schematic cross-sectional view of a light-emitting device 1 in accordance with the present embodiment. FIG. 5B is an energy band diagram showing examples of the Fermi level or band gap of each layer in a light-emitting element 2 in accordance with the present embodiment.

The light-emitting device 1 in accordance with the present embodiment may have the same structure as the light-emitting device 1 in accordance with Embodiment 1, except for the band gaps of the hole transport layer 6 and the electron transport layer 10.

The band gap gradually and substantially smoothly increases across the hole transport layer 6 from the end face thereof facing the anode 4 to the end face thereof facing the light-emitting layer 8 in the present embodiment as shown in FIG. 5B. The hole transport layer 6 in accordance with the present embodiment may be regarded as including on the anode 4 a stack of multiple extremely thin hole transport layers across which the band gap gradually increases. The hole transport layer 6, on the end face thereof facing the light-emitting layer 8, may have a band gap that is substantially equal to that of the electron blocking layer 14n. When this is the case, the hole transport layer 6 may be regarded as including an extremely thin hole transport layer structured in substantially the same manner on the end face thereof facing the light-emitting layer 8 as the electron blocking layer 14n is structured.

The hole transport layer 6 may be, for example, $Mg_{x3}Ni_{1-x3}O$, and the electron blocking layer 14n may be, for example, $Mg_{x4}Ni_{1-x4}O$ in the present embodiment, where x3 and x4 are real numbers in the range of 0≤x3≤x4<1, and x3 monotonically increases from 0 on the end face facing the anode 4 to x4 on the end face facing the light-emitting layer 8. The hole transport layer 6 in such a case may be formed by monotonically and gradually increasing the output power for Mg sputtering of the sputtering device in the process of forming the hole transport layer 6 by sputtering.

Meanwhile, in the present embodiment, as shown in FIG. 5B, the band gap gradually and substantially smoothly increases across the electron transport layer 10 from the end face thereof facing the cathode 12 to the end face thereof facing the light-emitting layer 8. The electron transport layer 10 in accordance with the present embodiment may be regarded as including on the cathode 12 a stack of multiple extremely thin electron transport layers across which the band gap gradually increases. The electron transport layer 10, on the end face thereof facing the light-emitting layer 8, may have a band gap that is substantially equal to that of the hole blocking layer 14p. When this is the case, the electron transport layer 10 may be regarded as including an extremely thin electron transport layer structured in substantially the same manner on the end face thereof facing the light-emitting layer 8 as the hole blocking layer 14p is structured.

The electron transport layer 10 may be, for example, $Mg_{y3}Zn_{1-y3}O$, and the hole blocking layer 14p may be, for example, $Mg_{y4}Zn_{1-y4}O$ in the present embodiment, where y3 and y4 are real numbers in the range of 0≤y3≤y4<1, and y3 monotonically increases from 0 on the end face facing the cathode 12 to y4 on the end face facing the light-emitting layer 8. When this is the case, the electron transport layer 10 may be formed by monotonically and gradually increasing the output power for Mg sputtering of the sputtering device in the process of forming the electron transport layer 10 by sputtering.

Holes and electrons may be transported between the layers in the light-emitting element 2 by the same mechanism in the present embodiment as the mechanism described in Embodiment 1, except for the transport of carriers in the hole transport layer 6 and the electron transport layer 10.

The ionization potential gradually and substantially smoothly increases across the hole transport layer 6 from the end face thereof facing the anode 4 to the end face thereof facing the light-emitting layer 8 in the present embodiment. Holes can be hence smoothly transported in the hole transport layer 6 as indicated by arrow H6 in FIG. 5B. The hole transport layer 6, on the end face thereof facing the light-emitting layer 8, has an ionization potential that is substantially equal to that of the electron blocking layer 14n, thereby presenting a very low barrier in injecting holes indicated by arrow H2 in FIG. 5B.

The light-emitting element 2 in the present embodiment is therefore capable of lowering the barrier in transporting holes from the hole transport layer 6 to the electron blocking layer 14n without affecting hole transport in the hole transport layer 6 as much as the light-emitting element 2 in the preceding embodiments does. The light-emitting element 2 in the present embodiment hence improves the efficiency of hole transport from the anode 4 to the electron blocking layer 14n, which in turn leads to an increased hole concentration in the light-emitting layer 8.

Likewise, the electron affinity gradually and substantially smoothly decreases across the electron transport layer 10 from the end face thereof facing the cathode 12 to the end face thereof facing the light-emitting layer 8 in the present embodiment. Electrons can hence smoothly transported in the electron transport layer 10 as indicated by arrow E6 in FIG. 5B. The electron transport layer 10, on the end face thereof facing the light-emitting layer 8, has an electron affinity that is substantially equal to that of the electron blocking layer 14n, thereby presenting a very low barrier in injecting electrons indicated by arrow E2 in FIG. 5B.

The light-emitting element 2 in the present embodiment is therefore capable of lowering the barrier in transporting electrons from the electron transport layer 10 to the hole blocking layer 14p without affecting electron transport in the electron transport layer 10 as much as the light-emitting element 2 in the preceding embodiments does. The light-emitting element 2 in the present embodiment hence improves the efficiency of electron transport from the cathode 12 to the hole blocking layer 14p, which in turn leads to an increased electron concentration in the light-emitting layer 8.

The present disclosure is not limited to the description of the embodiments above and may be altered within the scope of the claims. Embodiments based on a proper combination of technical means disclosed in different embodiments are encompassed in the technical scope of the present disclosure. Furthermore, new technological features can be created by combining different technical means disclosed in the embodiments.

REFERENCE SIGNS LIST

1 Light-emitting Device
2 Light-emitting Element
4 Anode
6 Hole Transport Layer
8 Light-emitting Layer
10 Electron Transport Layer
12 Cathode
14 Charge Blocking Layer
14n Electron Blocking Layer
14p Hole Blocking Layer
14i Insulation Layer
16 Quantum Dot

The invention claimed is:

1. A light-emitting element comprising:
an anode;
a hole transport layer;
a light-emitting layer containing quantum dots;
an electron transport layer; and
a cathode, arranged in this order,
the light-emitting element further comprising a first layer between the light-emitting layer and the hole transport layer and/or a second layer between the light-emitting layer and the electron transport layer, wherein
the first and second layers contain, as an element:
a transition metal element that is a component of an oxide semiconductor;
at least one element selected from Al, Mg, and Si; and
oxygen.

2. The light-emitting element according to claim 1, wherein
the transition metal element that is the component of the oxide semiconductor is at least one element selected from Ni, Cu, Cr, La, Zn, Ti, V, Mo, and W.

3. The light-emitting element according to claim 1, wherein the first or second layer has a thickness greater than or equal to 3 nm and less than or equal to 30 nm.

4. The light-emitting element according to claim 1, wherein the first or second layer has a thickness greater than or equal to 4 nm and less than or equal to 15 nm.

5. The light-emitting element according to claim 1, further comprising an insulation layer between the first or second layer and the light-emitting layer.

6. The light-emitting element according to claim 1, wherein both the first and second layers are provided.

7. The light-emitting element according to claim 1, wherein the hole transport layer has a band gap that gradually increases from an end face thereof facing the anode to an end face thereof facing the light-emitting layer.

8. The light-emitting element according to claim 1, wherein the electron transport layer has a band gap that gradually increases from an end face thereof facing the cathode to an end face thereof facing the light-emitting layer.

9. A light-emitting device comprising the light-emitting element according to claim 1.

10. A light-emitting element comprising:
an anode;
a hole transport layer;
a light-emitting layer containing quantum dots;
an electron transport layer; and
a cathode, arranged in this order,
the light-emitting element further comprising a first layer between the light-emitting layer and the hole transport layer, wherein
the first layer contains, as an element:
a transition metal element that is a component of an oxide semiconductor;
at least one element selected from Al, Mg, and Si; and
oxygen.

11. The light-emitting element according to claim 10, wherein the hole transport layer contains an oxide of any of Ni, Cu, and Cr or a mixture thereof.

12. The light-emitting element according to claim 10, wherein the first layer contains, as an element, Ni, Mg, and O.

13. A light-emitting element comprising:
an anode;
a hole transport layer;
a light-emitting layer containing quantum dots;
an electron transport layer; and
a cathode, arranged in this order,
the light-emitting element further comprising a second layer between the light-emitting layer and the electron transport layer, wherein
the second layer contains, as an element:
a transition metal element that is a component of an oxide semiconductor;
at least one element selected from Al, Mg, and Si; and
oxygen.

14. The light-emitting element according to claim 13, wherein the second layer contains no material composed of Si, Zn, and O.

15. The light-emitting element according to claim 13, wherein the electron transport layer contains no material composed of Zn, O, and a metal oxide containing at least one element selected from Si and Sn.

16. The light-emitting element according to claim 14, wherein the electron transport layer contains no material composed of Zn, O, and a metal oxide containing at least one element selected from Si and Sn.

17. The light-emitting element according to claim 13, wherein the second layer contains, as an element, Zn, Mg, and O.

18. The light-emitting element according to claim 13, wherein the electron transport layer contains a chalcogenide of any of Zn, Ti, In, Ga, Sn, V, Mo, and W or a mixture thereof of these.

19. The light-emitting element according to claim 13, wherein the second layer contains a non-oxygen element that is a component of an oxide insulator greater than or equal to 90 at % and less than 100 at %.

20. The light-emitting element according to claim 13, wherein the second layer contains, as a component element thereof, at least one of component elements of the electron transport layer.

* * * * *